US008836340B2

(12) United States Patent
Aoki et al.

(10) Patent No.: US 8,836,340 B2
(45) Date of Patent: Sep. 16, 2014

(54) ASSEMBLED BATTERY SYSTEM AND FAILURE DETECTION METHOD OF ASSEMBLED BATTERY SYSTEM

(75) Inventors: Hironobu Aoki, Kanagawa-ken (JP); Mami Mizutani, Tokyo (JP); Yuuki Kuwano, Tokyo (JP); Takehiro Usumori, Nagano-ken (JP); Morio Suzuki, Tokyo (JP); Takashi Morimoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 457 days.

(21) Appl. No.: 13/312,751

(22) Filed: Dec. 6, 2011

(65) Prior Publication Data
US 2012/0146652 A1   Jun. 14, 2012

(30) Foreign Application Priority Data
Dec. 8, 2010   (JP) .................. 2010-274045

(51) Int. Cl.
*G01N 27/416* (2006.01)
*G01R 31/36* (2006.01)
*G01R 31/02* (2006.01)

(52) U.S. Cl.
CPC .......... *G01R 31/3658* (2013.01); *G01R 31/026* (2013.01)
USPC ........................................ 324/433

(58) Field of Classification Search
USPC .......... 324/426, 427, 430; 320/116, 122, 132, 320/134, 136
See application file for complete search history.

(56) References Cited

U.S. PATENT DOCUMENTS

| | | | | |
|---|---|---|---|---|
| 5,850,136 | A * | 12/1998 | Kaneko | 320/119 |
| 6,034,506 | A * | 3/2000 | Hall | 320/117 |
| 7,446,575 | B2 * | 11/2008 | Yano et al. | 320/122 |
| 2009/0102421 | A1 * | 4/2009 | Imai | 320/118 |

* cited by examiner

*Primary Examiner* — Edward H Tso
(74) *Attorney, Agent, or Firm* — Baker Botts L.L.P.

(57) ABSTRACT

An assembled battery system is disclosed that includes a plurality of serially-connected battery cells; voltage detecting lines connectable at one ends to electrodes of the battery cells of the assembled battery; electric resistors serially-connected at one ends to the other ends of the voltage detecting lines; capacitors connected to the other ends of the electric resistors, each of the capacitors being configured to electrically interconnect one of the voltage detecting lines and the other voltage detecting line; voltage measuring circuits connected respectively to each of the voltage detecting lines; electrically openable short-circuiting switches arranged between the capacitors and the voltage measuring circuits and parallel-connected to the capacitors; and a monitoring circuit that detects a difference between a first measurement result and a second measurement result with respect to each of the short-circuiting switches and a failure of the voltage detecting lines, the short-circuiting switches or the voltage measuring circuits.

20 Claims, 6 Drawing Sheets

ASSEMBLED BATTERY SYSTEM AND FAILURE DETECTION METHOD OF ASSEMBLED BATTERY SYSTEM

CROSS-REFERENCE TO RELATED APPLICATIONS

This application is based upon and claims the benefit of priority from Japanese Patent Application No. 2010-274045 filed on Dec. 8, 2010, the entire content of which are incorporated herein by reference.

TECHNICAL FIELD

The present disclosure relates to an assembled battery system.

BACKGROUND

In an assembled battery system using serially-connected battery cells, it is typical that a voltage of each individual battery cell is measured and used for control purposes. Particularly, in case of a secondary battery such as a lithium battery, a voltage of each individual battery cell needs to be correctly and accurately measured from the viewpoint of safety and performance utilization. To assure correct measurement of the battery cell voltage, it is important to reliably detect a circuit failure, especially disconnection of a voltage detecting line connected to each of the battery cells.

Methods of detecting disconnection of a voltage detecting line are selected depending on the types of circuits used. Examples of the circuits for measurement of a battery cell voltage include a method of directly measuring a battery cell voltage and another method of measuring a battery cell voltage charged in a capacitor parallel-connected to a battery cell. There are also known a number of methods in which disconnection is detected by temporarily operating the measurement circuits and determining the changing fashion of a voltage.

The method of directly measuring a battery cell voltage can determine occurrence of disconnection due to the fact that the disconnection makes it impossible to measure a voltage itself. There is proposed a method of detecting minute disconnection using the fact that when a resistor circuit is temporarily connected to a battery cell in parallel, a voltage is changed by a specified value or more if disconnection occurs. In the method of measuring a battery cell voltage charged in a capacitor, it is sometimes the case that a voltage is generated in the capacitor despite the non-occurrence of disconnection. Given this, there is proposed a method using the principle that when a resistor circuit is connected to a battery cell in parallel, a voltage measured is greatly changed if disconnection occurs.

In any of the voltage measuring methods mentioned above, if an RC-filter is connected between a voltage detecting unit and a battery cell, then it is possible to eliminate inverter noises otherwise generated at the load side of the battery. This is advantageous in increasing measurement accuracy. In the second method using a capacitor to measure a voltage, the capacitor has a noise eliminating function. However, most of the capacitors used for measurement purposes are usually small in capacity, which limits their function as a noise filter. An increased noise eliminating effect can be obtained by connecting, independently of the measuring unit, an RC filter as a combination of a large-capacity capacitor and a resistor. Thus, use of the RC filter has a merit regardless of the voltage measuring methods.

In the method using the RC filter, a resistor is connected to a voltage detecting line drawn from a battery cell and a capacitor is connected to the connection point between the resistor and the voltage detecting line in parallel with the battery cell. If disconnection occurs in the voltage detecting line, then the voltage of the corresponding battery cell should be measured as an abnormal value. In the circuit having the RC filter connected thereto, however, there is a possibility that, even when disconnection occurs in the voltage detecting line, a voltage value differing from the voltage of the battery cell may be measured due to the electric charges remaining in the capacitor of the RC filter.

The methods set forth above are applicable to a battery cell voltage measuring circuit having no RC filter and cannot be applied to a measuring circuit provided with a RC filter. In these methods, it is determined to be normal if a voltage is not changed when a short-circuiting circuit is connected. As such, these methods suffer from a problem since they cannot distinguish the non-occurrence of disconnection of the voltage detecting line from the failure of the short-circuiting circuit.

DETAILED DESCRIPTION

In the present embodiment, the voltage values of three battery cells including an inspection target battery cell and two battery cells positioned at both sides of the inspection target battery cell are used to detect the disconnection of a voltage detecting line and the failure of a short-circuiting circuit in an assembled battery system including a battery cell voltage measuring circuit provided with a RC filter. The battery cell voltages of the three battery cells measured when a short-circuiting circuit connected to the inspection target battery cell is temporarily energized are compared with the battery cell voltages of the three battery cells measured when the short-circuiting circuit is not energized. Using the combination of voltage changes thus obtained, it is detected whether the disconnection of the voltage detecting line and the failure of the short-circuiting circuit occur.

One embodiment of an assembled battery system according the present disclosure will now be described with reference to the accompanying drawings.

Figure 1:
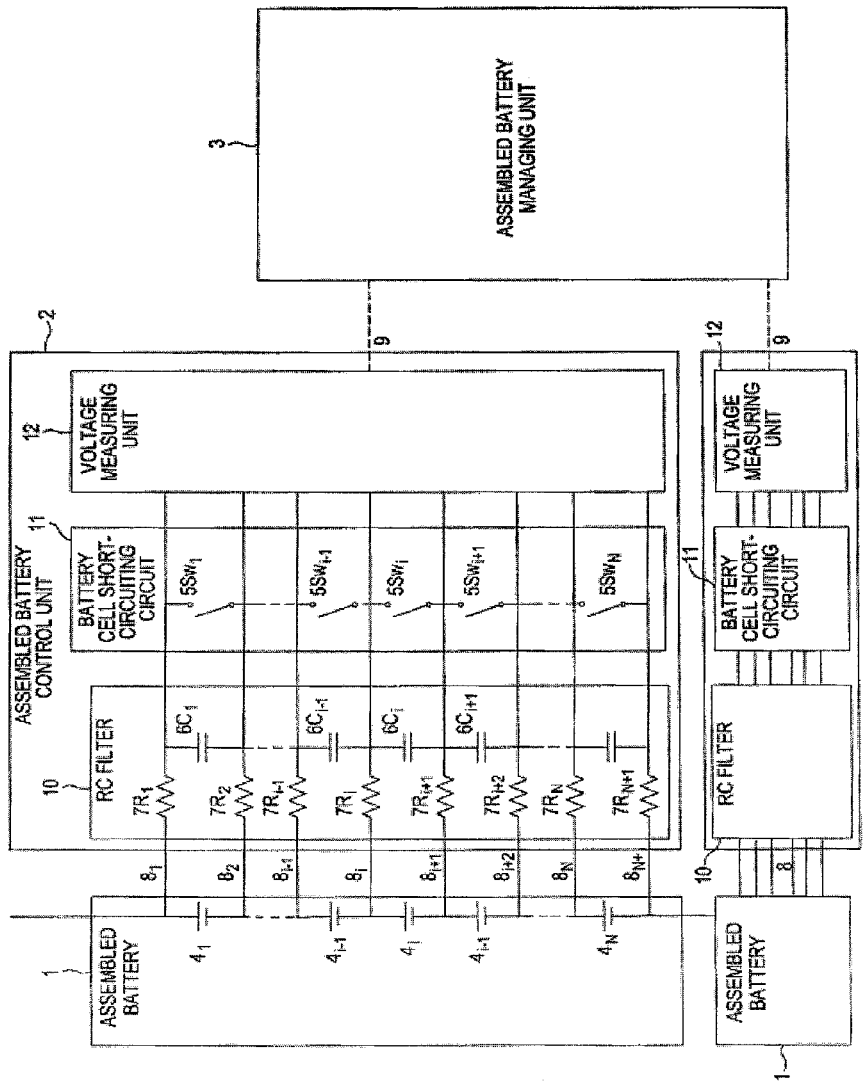
FIG. 1 is a schematic diagram showing the configuration of an assembled battery system according to one embodiment.

FIG. 1 is a schematic diagram showing an assembled battery system according to one embodiment, which includes an assembled battery 1, an assembled battery control unit 2 and an assembled battery managing unit 3.

The assembled battery 1 and the assembled battery control unit 2 are connected to each other via voltage detecting lines 8. The assembled battery control unit 2 and the assembled battery managing unit 3 are interconnected via communication lines 9. The assembled battery 1 includes, as its components, serially-connected N pieces of battery cells 4-1 to 4-N and voltage detecting lines 8-1 to 8-N+1 drawn from the positive and negative electrode sides of the respective battery cells. The assembled battery control unit 2 includes, as its components, a RC filter 10 that is composed of capacitors $6C_1$ to $6C_N$ parallel-connected to the respective battery cells 4 via the voltage detecting lines 8 and resistors $7R_1$ to $7R_{N+1}$ connected to the voltage detecting lines 8 between the battery cells 4 and the capacitors $6C_1$ to $6C_N$, a battery cell short-circuiting circuit 11 controlled by short-circuiting switches $5Sw_1$ to $5Sw_N$ parallel-connected to the battery cells 4 and the capacitors 6, and a voltage measuring unit 12 for measuring the voltage values between the voltage detecting lines 8. The effects offered by the present disclosure are attainable regardless of the voltage measuring manner of the voltage measuring unit 12.

The assembled battery 1, the assembled battery control unit 2 and the assembled battery managing unit 3 may be combined in a one-to-one-to-one, one-to-one-to-multiple or multiple-to-multiple-to-multiple combination or in many other combinations. For the sake of simplicity, the present embodiment will be described by taking, as an example, an assembled battery system that includes one assembled battery 1 having N pieces of battery cells 4, one assembled battery control unit 2 for measuring the voltage of the N pieces of battery cells 4 of the assembled battery 1 and one assembled battery managing unit 3.

The voltage measuring unit 12 serves to measure the voltage of the battery cell $4i$ by measuring the voltage between the voltage detecting lines $8_i$ and $8_{i+1}$ connected to the positive and negative electrode sides of each of the battery cells. In this circuit, the inverter noises generated due to such as the voltage conversion in the main circuit of the assembled battery 1 are eliminated by the RC filter composed of the resistors $7R_i$ and the capacitors $6C_i$. This makes it possible to accurately measure the battery cell voltage. In reality, the voltage measuring unit 12 measures the voltage of the capacitor $C_i$. All of the resistors 7 and the capacitors 6 used herein have the same characteristics with respect to the respective battery cells. The battery cell voltage thus measured is transmitted to the assembled battery managing unit 3 as a monitoring circuit via the communication lines 9.

Using the voltage values of the respective battery cells acquired by the voltage measuring unit 12, the assembled battery managing unit 3 performs such processing as calculation of the residual capacity and the residual lifespan of the battery, detection of the over-charge and the over-discharge, capacity equalization of the battery cells and detection of an anomaly of the battery.

The battery cell short-circuiting circuit 11 is provided to equalize the capacities of the respective battery cells but may also be used as a disconnection detecting unit as described later. The short-circuiting switches $5Sw_1$ to $5Sw_N$ can be electrically opened and closed independently of one another according to the command supplied from the assembled battery managing unit 3.

A principle of failure detection will now be described in detail. In the following description, a principle of disconnection detection in the embodiment configured as above will be described by taking, as an example, a measuring circuit part of the mutually-adjoining battery cells $4i-1$, $4i$ and $4i+1$. For purposes of explanation, the circuit states are divided into: a) a state wherein the disconnection has not occurred; b) a state wherein the disconnection has occurred in the voltage detecting line $8_i$; c) a state wherein the disconnection has occurred in the voltage detecting line $8_{i+1}$; d) a state wherein the short-circuiting switch $5Sw_i$ is malfunctioning; and e) other failure state. As used herein, Vn denotes the actual voltage of the battery cell n, Xn denotes the measured voltage measured by the voltage measuring unit 12 (a typical voltage measuring unit) with the short-circuiting switch Swn kept in an off-state, and Zn signifies the measured voltage measured by the voltage measuring unit 12 (a failure-detecting voltage measuring unit) with the short-circuiting switch Swn kept in an on-state. Since the time taken for the voltage to get stabilized after the short-circuiting switches $5Sw_i$ is turned on varies with the capacity of the capacitor $6C_i$, a specified waiting time Ton is set between the on-timing of the short-circuiting switch $5Sw_i$ and the measuring timing of the voltage of each of the battery cells. Similarly, a specified waiting time Toff is set between the off-timing of the short-circuiting switch $5Sw_i$ and the timing at which a normal battery cell voltage can be measured.

Figure 2A:
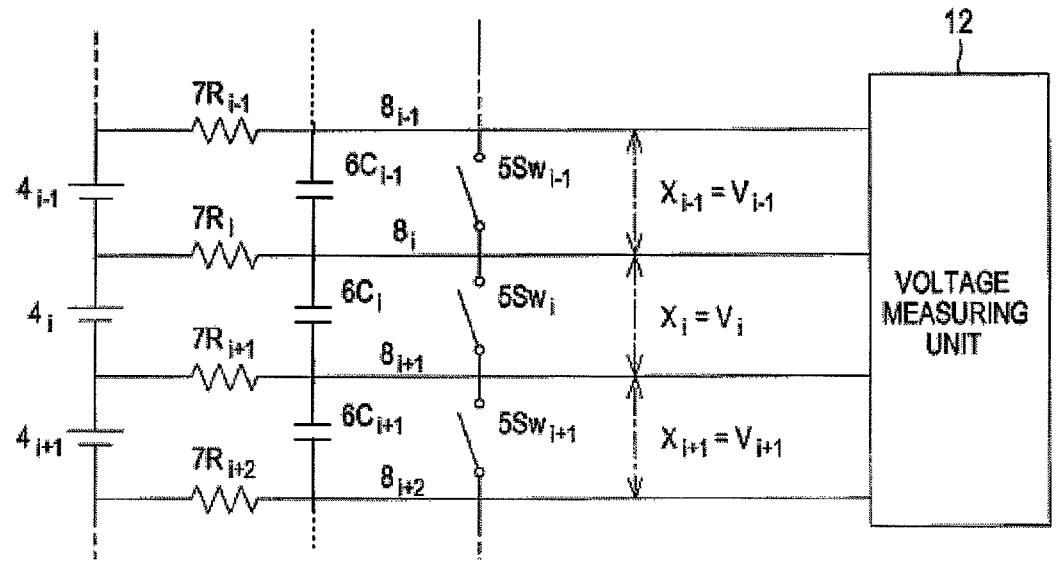
FIGS. 2A and 2B are schematic diagrams showing "a) a state wherein the disconnection has not occurred" for description of the disconnection detection principle.
Figure 2B:
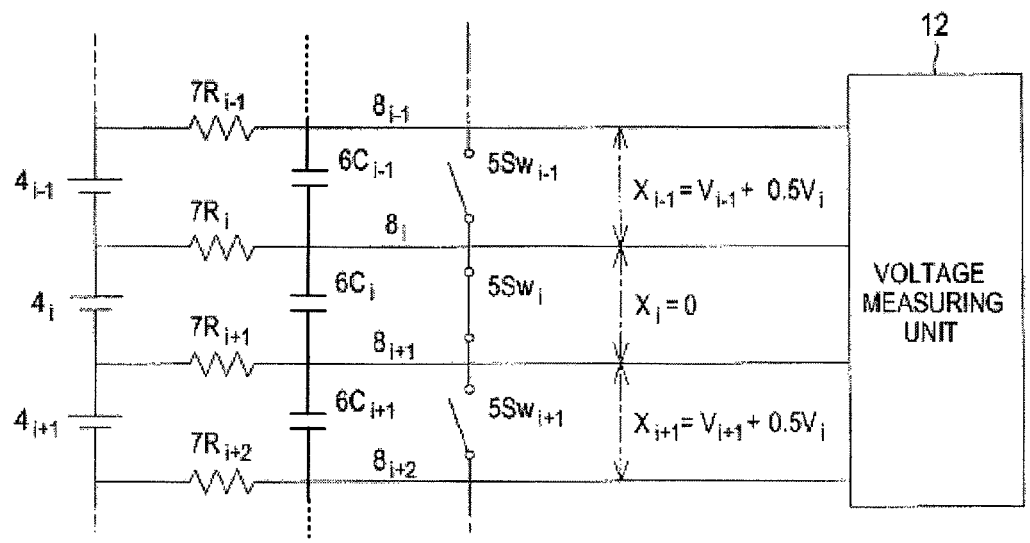

First, description will be given on a) the normal state with no occurrence of disconnection. In FIGS. 2A and 2B, there is shown a circuit kept in the a) state. When the short-circuiting switch $5Sw_i$ is not turned on, the measured voltage $X_i$ between the voltage detecting lines $8_i$ and $8_{i+1}$ corresponding to the battery cell $4i$ and the measured voltages $X_{i-1}$ and $X_{i+1}$ between the voltage detecting lines corresponding to the adjoining battery cells $4_{i-1}$ and $4_{i+1}$ are represented by: $X_{i-1}=V_{i-1}$; $X_i=V_i$; and $X_{i+1}=V_{i+1}$.

Next, when the short-circuiting switch $5Sw_i$ is turned on, the measured voltages $Z_{i-1}$, $Z_i$ and $Z_{i+1}$ between the battery cell 4, and the adjoining battery cells $4_{i-1}$ and $4_{i+1}$ are represented by: $Z_{i-1}=V_{i-1}+0.5$ ($V_i$–divided voltage corresponding to a resistance value of the short-circuiting switch); $Z_i=0+$ (divided voltage corresponding to a resistance value of the short-circuiting switch); and $Z_{i+1}=V_{i+1}+0.5$ ($V^i$–divided voltage corresponding to a resistance value of the short-circuiting switch). The divided voltage corresponding to the resistance value of the short-circuiting switch is negligibly small and thus can be regarded as nearly zero. As such, the measured voltages $Z_{i-1}$, $Z_i$ and $Z_{i+1}$ can be represented by: $Z_{i-1}=V_{i-1}+0.5V_i$; $Z_i=0$; and $Z_{i+1}=V_{i+1}+0.5V_i$. The condition of the circuit available at this time is shown in FIG. 2B. The measured voltages of the battery cells other than the battery cells mentioned above remain unchanged.

Figure 3A:
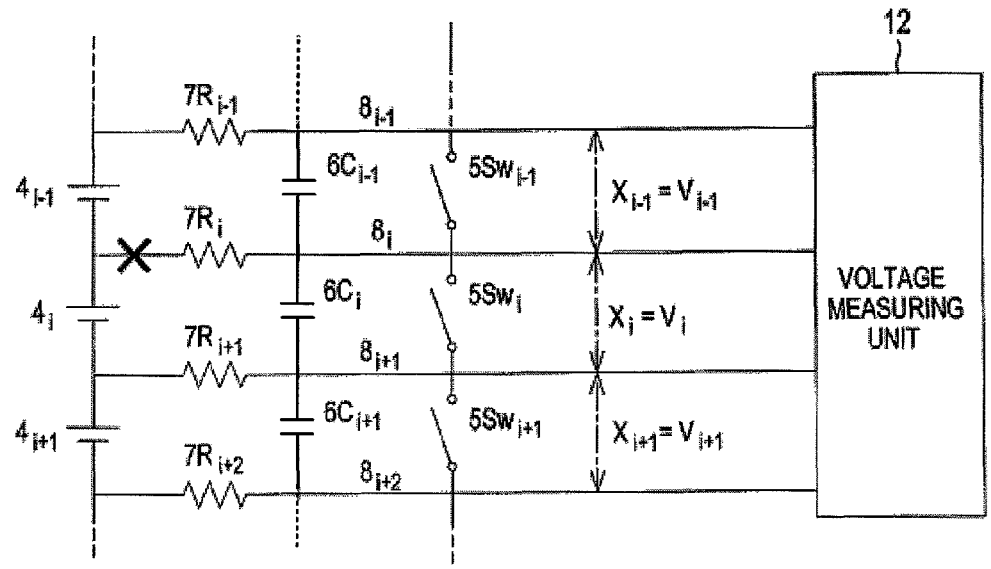
FIGS. 3A and 3B are schematic diagrams showing "b) a state wherein the disconnection has occurred in the voltage detecting line $8_i$," for description of the disconnection detection principle.
Figure 3B:
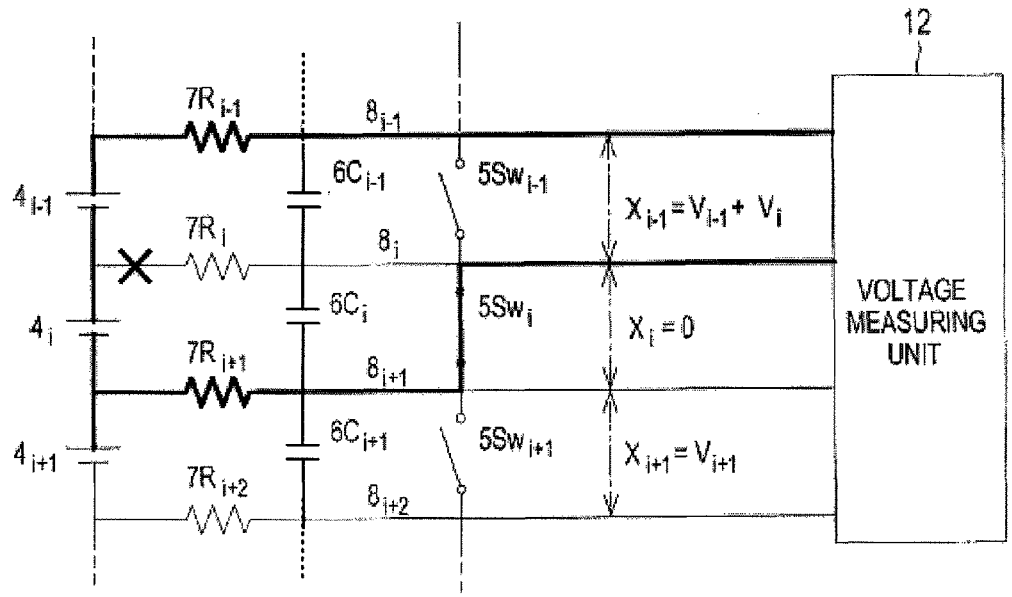

Second, description will be given on b) the disconnection state of the voltage detecting line $8_i$. In FIGS. 3A and 3B, there is shown a circuit kept in the b) state. Electric charges remain in the capacitor $6C_i$ until the short-circuiting switch $5Sw_i$ is turned on after occurrence of disconnection. In such a case, there is a possibility that a voltage value close to the battery cell voltage $V_i$ may be measured as the voltage $X_i$. The condition of the circuit available at this time is shown in FIG. 3A. The measured voltages $X_{i-1}$, $X_i$ and $X_{i+1}$ before turning on the short-circuiting switch $5Sw_i$ are represented by: $X_{i-1}=V_{i-1}$; $X_i=V_i$; and $X_{i+1}=V_{i+1}$. Next, FIG. 3B shows the condition of the circuit after a specified waiting time Ton is lapsed from the on-timing of the short-circuiting switch $5Sw_i$. Due to the disconnection, the voltage of the portion indicated by a thick solid line is measured as the voltage $Z_{i-1}$, which is equivalent to the voltage of two battery cells. Thus, the measured voltages $Z_{i-1}$, $Z_i$ and $Z_{i+1}$ after turning on the short-circuiting switch $5Sw_i$ can be represented by: $Z_{i-1}=V_{i-1}+V_i$; $Z_i=0$; and $Z_{i+1}=V_{i+1}$.

Figure 4A:
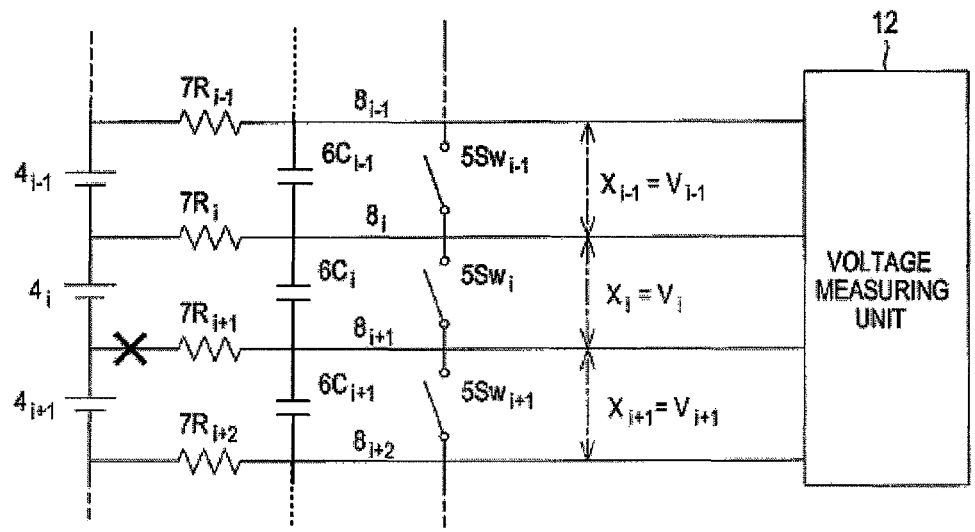
FIGS. 4A and 4B are schematic diagrams showing "c) a state wherein the disconnection has occurred in the voltage detecting line $8_{i+1}$" for description of the disconnection detection principle.
Figure 4B:
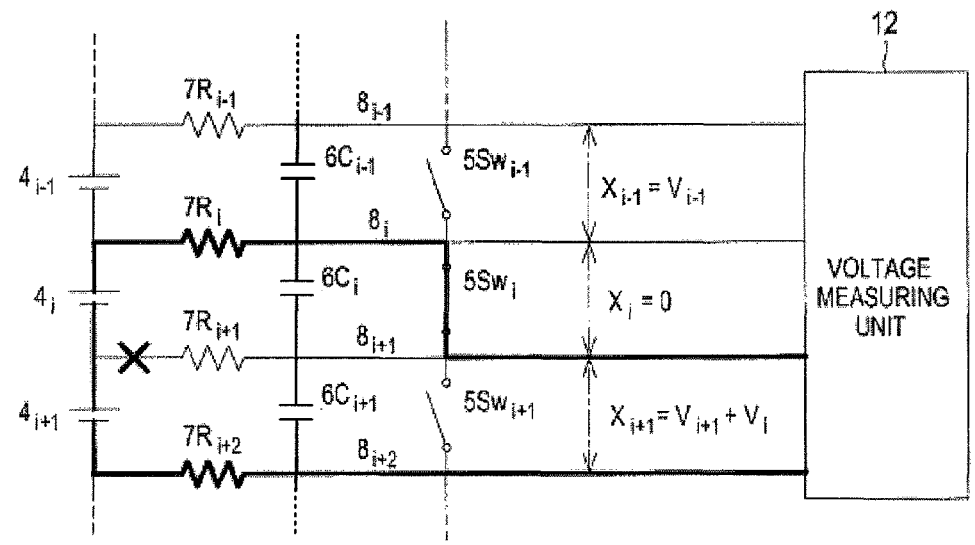

Third, description will be given on c) the disconnection state of the voltage detecting line $8_{i+1}$. In FIGS. 4A and 4B, there is shown a circuit kept in the c) state. Just like the b) state, electric charges remain in the capacitor $6C_i$ until the short-circuiting switch $5Sw_i$ is turned on after occurrence of disconnection. In such a case, there is a possibility that a voltage value close to the battery cell voltage $V_i$ may be measured as the voltage $X_i$. The condition of the circuit available at this time is shown in FIG. 4A. The measured voltages $X_{i-1}$, $X_i$, and $X_{i+1}$ before turning on the short-circuiting switch $5Sw_i$ are represented by: $X_{i-1}=V_{i-1}$; $X_i=V_i$; and $X_{i+1}=V_{i+1}$. Next, FIG. 4B shows the condition of the circuit after a specified waiting time Ton is lapsed from the on-timing of the short-circuiting switch $5Sw_i$. Due to the disconnection, the voltage of the portion indicated by a thick solid line is measured as the voltage $Z_{i+1}$, which is equivalent to the voltage of two battery cells. Thus, the measured voltages $Z_{i-1}$, $Z_i$ and $Z_{i+1}$ after turning on the short-circuiting switch $5Sw_i$ can be represented by: $Z_{i-1}=V_{i-1}$; $Z_i=0$; and $Z_{i+1}=V_{i+1}+V_{i-1}$.

Figure 5A:
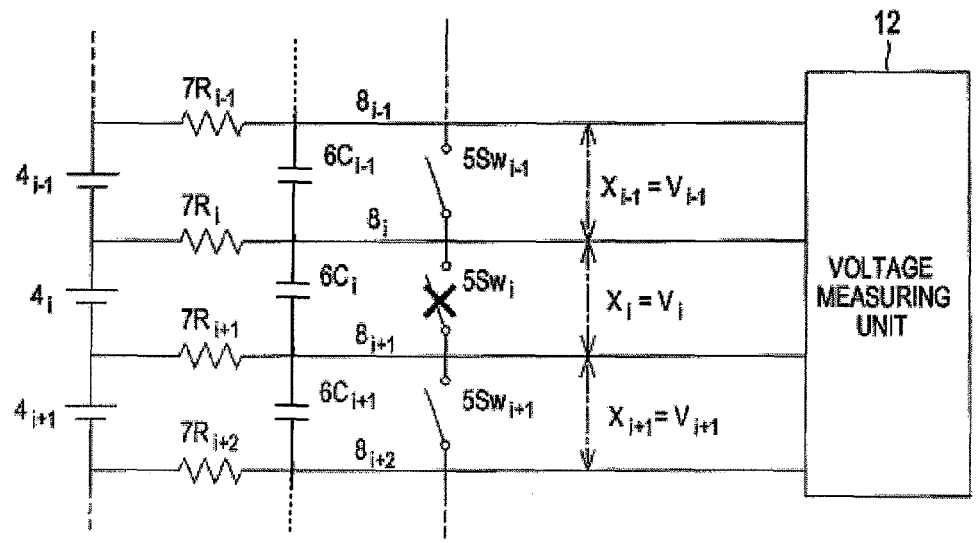
FIGS. 5A and 5B are schematic diagrams showing "d) a state wherein the short-circuiting switch $5Sw_i$ is malfunctioning" for description of the disconnection detection principle.
Figure 5B:
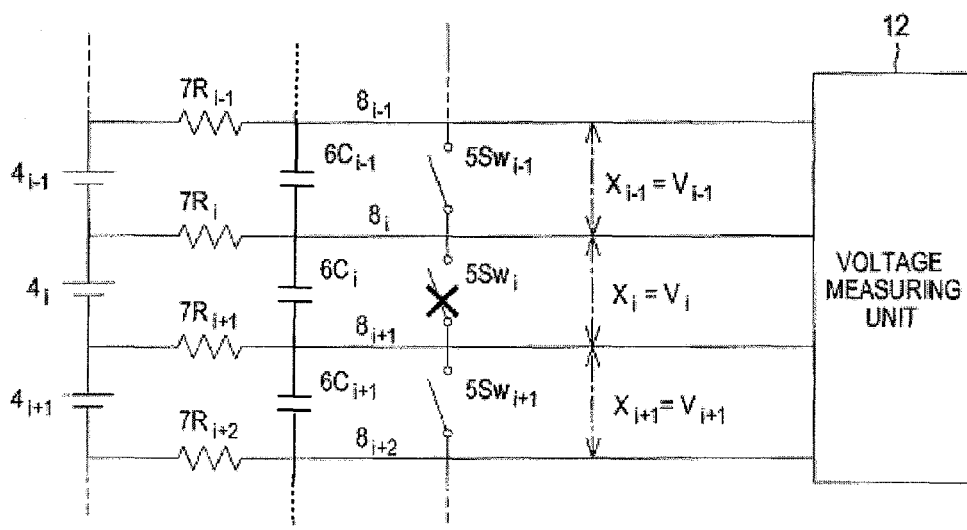

Fourth, description will be given on d) the failure state of the short-circuiting switch $5Sw_i$. In FIGS. 5A and 5B, there is shown a circuit kept in the d) state. Like the b) and c) states, electric charges remain in the capacitor $6C_i$ until the short-circuiting switch $5Sw_i$ is turned on after occurrence of disconnection. In such a case, there is a possibility that a voltage value close to the battery cell voltage $V_i$ may be measured as the voltage $X_i$. The condition of the circuit available at this time is shown in FIG. 5A. The measured voltages $X_{i-1}$, $X_i$, and $X_{i+1}$ before turning on the short-circuiting switch $5Sw_i$ are represented by: $X_{i-1}=V_{i-1}$; $X_i=V_i$; and $X_{i+1}=V_{i+1}$. In this state, due to the failure of the short-circuiting switch $5Sw_i$, the circuit condition is not changed even if a command is issued to turn on the short-circuiting switch $5Sw_i$. Thus, the measure voltages $Z_{i-1}$, $Z_i$ and $Z_{i+1}$ remain unchanged. The condition of the circuit available at this time is shown in FIG. 5B. As such, the measured voltages $Z_{i-1}$, $Z_i$ and $Z_{i+1}$ can be represented by: $Z_{i-1}=V_{i-1}$; $Z_i=V_i$; and $Z_{i+1}=V_{i+1}$.

Finally, description will be given on e) other failure state. If the battery cell voltage is changed in other states than the a), b), c) and d) states, then it is not possible to clearly determine that such voltage change is caused by the disconnection of the voltage detecting lines or the failure of the short-circuiting switches. It is presumed that a failure occurs in any one portion involving the voltage detection. For example, there may be a case that, due to the failure of the battery cell selecting function of the voltage measuring unit, the voltage $Z_m$ (m≠i, m≠i+1, m≠i−1 and 1<m<N) of the battery cell $4m$ is mistakenly measured against the intention to measure the voltage $Z_i$ of the battery cell $4_i$. If the short-circuiting switch is turned on in this state, then voltage values are erroneously measured as represented by: $Z_{i-1}=V_{i-1}+0.5V_i$; $Z_i=V_m$; and $Z_{i+1}=V_{i+1}+0.5V_i$.

If $V_m$ is a value close to $V_i$ in the aforementioned case, then it is possible to detect the voltage increase in relation to $Z_{i-1}$ and $Z_{i+1}$, which indicates that the diagnosis is correctly performed. However, it is not possible to detect the expected voltage decrease with respect to $Z_i$. This is also an important failure that makes it impossible to correctly measure a voltage. Accordingly, this provides a merit in detecting failures.

Conditions of Failure Detection

The degree of increase and decrease in voltage described above in respect of the failure detection principle is based on an ideal circuit and may vary depending on the circuit mounting conditions and the measuring timing, e.g., the resistance components of switches. As such, the actually measured values may not necessarily coincide with the theoretical values. In view of this, a threshold value $Th_{up}$ of the increased value of $X_i$ value and a threshold value $Th_{down}$ of the decreased values of $X_{i-1}$ and $X_{i+1}$ are arbitrarily set pursuant to the variation width of the battery cell voltage expected to occur in the a) state, namely in the normal state with no occurrence of failures. Then, it is determined whether the measured voltages $X_i$, $X_{i-1}$ and $X_{i+1}$ are changed by the threshold values $Th_{up}$ and $Th_{down}$ or more. The threshold values $Th_{up}$ and $Th_{down}$ are decided relative to the value of $X_i$. For example, the conditions for determining whether the threshold values $Th_{up}$ and $Th_{down}$ and the voltage values are changed as expected may be set as follows.

[Threshold Values of Voltage Variation]:

$$Th_{up}=X_i\times 0.125; \text{ and}$$

$$Th_{down}=X_i\times 0.125$$

[Determination Conditions of the Increase in $Z_i$]:

$$Z_i \leq X_i - Th_{down}$$

[Determination Conditions of the Decrease in $Z_{i-1}$ and $Z_{i+1}$]:

$$Z_{i+1} \geq X_{i+1}+Th_{up}; \text{ and}$$

$$Z_{i-1} \geq X_{i-1}+Th_{up}$$

The failure determination conditions mentioned above are collectively shown in Table 1 below. By using the voltage $X_i$ measured with the short-circuiting switch turned off, the voltage $Z_i$ measured with the short-circuiting switch turned on and the failure determination conditions shown in Table 1 makes, it becomes possible to detect the disconnection of the voltage detecting lines, the failure of the short-circuiting switches and other failures associated with voltage measurement.

TABLE 1

| Cell i − 1 Voltage | Up | Up | Not Up | Not Up | Up | Up | Not Up | Not Up |
|---|---|---|---|---|---|---|---|---|
| Cell i Voltage | Down | Down | Down | Down | Not Down | Not Down | Not Down | Not Down |
| Cell i + 1 Voltage | Up | Not Up | Up | Not Up | Up | Not Up | Up | Not Up |
| Determination | Normal | Line i Cut | Line i + 1 Cut | | Voltage Measuring Unit Became Abnormal | | Switch $Sw_i$ Failed | |

Figure 6:
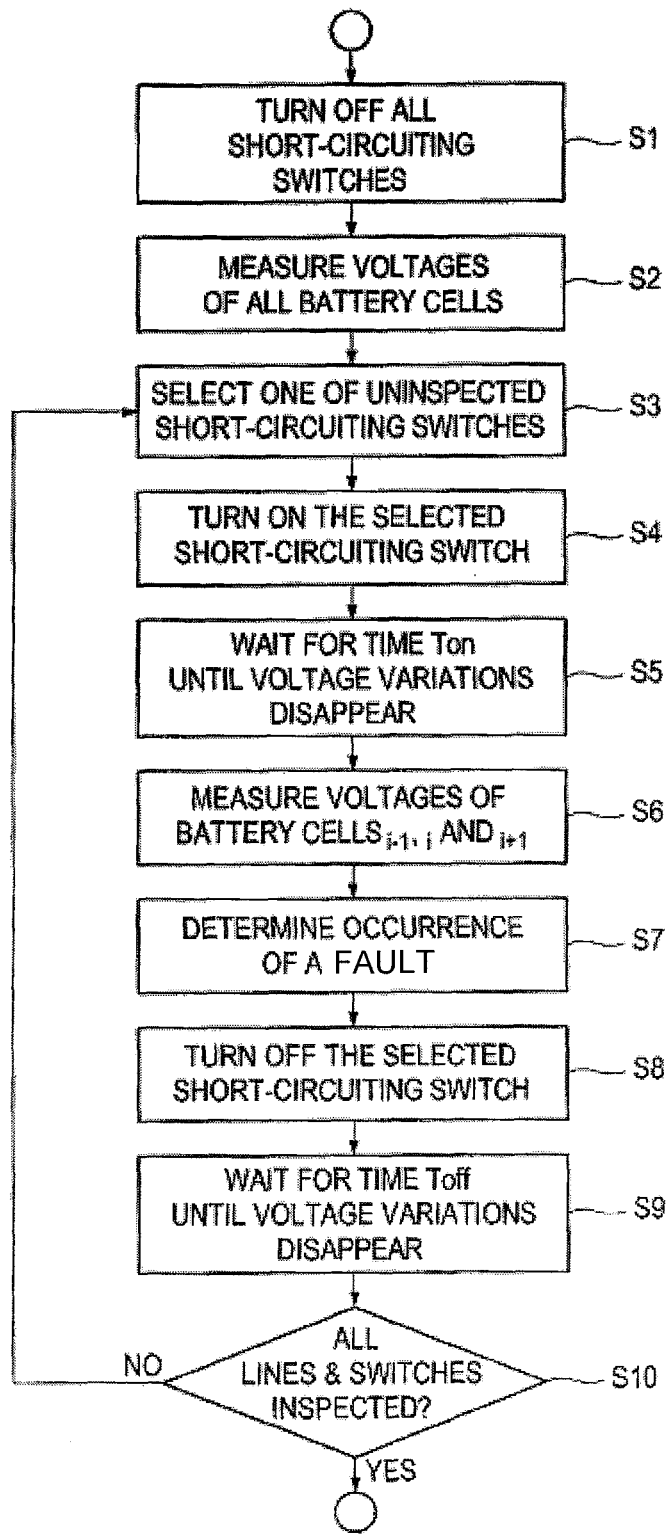
FIG. 6 is a flowchart showing the steps of a disconnection detecting process.

Description will now be made on one example of a process that actually detects failures in the configuration of the present embodiment by using the failure determination conditions noted above. FIG. 6 shows a failure determination process of Example 1. The control of this process and the necessary operation are performed by the assembled battery managing unit 3.

In the first step S1 of the failure determination process, all short-circuiting switches are turned off. In the second step S2, the voltages $X_m$ of all the battery cells are measured with the short-circuiting switches turned off, namely in a typical measuring method. The third to ninth steps are repeated until there remain no uninspected voltage detecting lines. In the third step S3, a short-circuiting switch i that is not yet used in inspection is selected. In the fourth step S4, the short-circuiting switch i thus selected is turned on. In the fifth step S5, an operator just waits for a time Ton until the variations of the voltage values to be measured disappear. In the sixth step S6, the voltages $X_{i-1}$, $X_i$ and $X_{i+1}$ of the battery cells i−1, i and i+1 are measured. In the seventh step S7, failure determination is performed using the voltages measured in the sixth step S6, the voltages measured in the second step S2 and the relationship shown in Table 1. In the eighth step S8, the short-circuiting switches i are turned off and restored to the original state. In the ninth step S9, the operator just waits for a time Toff until the variations of the voltage values to be measured disappear. When the first to ninth steps are completed, inspection end conditions are determined in the tenth step S10.

The inspection end conditions include: A) all the voltage detecting lines and all the short-circuiting switches having been inspected; and B) all the voltage detecting lines having been inspected. The condition B) may be used as the inspection end conditions in case where the inspection does not aim at detecting the failure of the short-circuiting switches. When the condition A) is adopted as the inspection end conditions, the minimum number of diagnosis is N times. If the condition B) is adopted as the inspection end conditions, then the minimum number of diagnosis can be given by: the number of voltage detecting lines=N+1; and the number of times of inspection required=(N+1)/2 (where N denotes the number of battery cells and the number of digits after decimal point is rounded off). When the inspection does not seek to detect the failure of the short-circuiting switches, the inspection end conditions can be determined by merely measuring the voltages of the battery cell i and the adjoining battery cell i+1.

As described above, the present embodiment provides an assembled battery system with a function of detecting disconnection of the voltage detecting lines. The assembled battery system includes an assembled battery, an assembled battery control unit and an assembled battery managing unit. The assembled battery includes a plurality of serially-connected battery cells and a plurality of voltage detecting lines drawn from the positive and negative electrode sides of the battery cells. The assembled battery control unit includes a battery cell short-circuiting circuit and a voltage measuring unit for measuring the voltages between the voltage detecting lines. The battery cell short-circuiting circuit includes RC filters, each of which is composed of capacitors parallel-connected to the battery cells via the voltage detecting lines and resistors serially-connected to the battery cells, and short-circuiting switches parallel-connected to the battery cells and the capacitors. The assembled battery managing unit is connected to the assembled battery control unit via communication lines. The assembled battery managing unit is configured to compare the voltages of the battery cells measured by the voltage measuring unit when the short-circuiting switches are turned off with the voltages of the battery cells measured by the voltage measuring unit when the short-circuiting switches are turned on. If one of the voltage detecting lines is disconnected, then the battery cell voltage at one of the positive and negative electrode sides measured when the short-circuiting switches are turned on becomes greater than the voltage measured when the short-circuiting switches are turned off. The battery cell voltage at the other electrode side of each of the battery cells measured when the short-circuiting switches are turned on becomes smaller than the voltage measured when the short-circuiting switches are turned off. The disconnection of the voltage detecting lines is detected using this principle.

The disconnection detecting conditions can be rearranged as follows. When there exist three serially and continuously connected battery cells i−1, i and i+1, a voltage detecting line i drawn from between the battery cells i−1 and i and a voltage detecting line i+1 drawn from between the battery cells i and i+1, the voltages measured when the short-circuiting switch i is turned off are assumed to be $X_{i-1}$, $X_i$ and $X_{i+1}$. The voltages measured when the short-circuiting switch i is turned on are assumed to be $Z_{i-1}$, $Z_i$ and $Z_{i+1}$. K is assumed to be an integer satisfying an inequity 0<K<1.

Under this assumption, it is determined that no failure has occurred if the following condition A is satisfied.
[Condition A]:

$$Z_{i-1}=X_{i-1}+0.5X_i \times K;$$

$$Z_i=0+X_i \times (1-K); \text{ and}$$

$$Z_{i+1}=X_{i+1}+0.5X_i \times K.$$

It is determined that disconnection of the voltage detecting line i+1 has occurred if the following condition B is satisfied.
[Condition B]:

$$Z_{i-1}=X_{i-1}+X_i \times K;$$

$$Z_i=0+X_i \times (1-K); \text{ and}$$

$$Z_{i+1}=X_{i+1}.$$

It is determined that disconnection of the voltage detecting line i has occurred if the following condition C is satisfied.
[Condition C]:

$$Z_{i-1}=X_{i-1}+X_i;$$

$$Z_i=0+X_i-(1-K); \text{ and}$$

$$Z_{i+1}=X_{i+1}+X_i \times K.$$

The assembled battery system can realize a function of detecting the failure of the short-circuiting switches, by using the principle that, if the short-circuiting circuit suffers from a failure in the comparison step, the battery cell voltage at one of the positive and negative electrode sides and the battery cell voltage at the other side measured when the short-circuiting switches are tuned on remain unchanged regardless of the on/off state of the short-circuiting switches. It is determined that a failure has occurred in the short-circuiting circuit including the short-circuiting switches if the following condition D is satisfied.
[Condition D]:

$$Z_{i-1}=X_{i-1};$$

$$Z_i=X_i; \text{ and}$$

$$Z_{i+1}=X_{i+1}.$$

Additionally, even when a failure has occurred in a portion other than the voltage detecting lines and the short-circuiting circuit, the assembled battery system can detect the failure through the comparison step mentioned above. It is determined that a failure has occurred in the voltage measuring unit if the following condition E is satisfied.
[Condition E]:
In case of failure to satisfy [Condition A], [Condition B], [Condition C] and [Condition D]

When a plurality of assembled battery systems exists, the failure detecting operations can be simultaneously performed with respect to all the assembled battery systems by providing a plurality of battery control units and causing the battery control units to perform the aforementioned comparison step in parallel.

In the present embodiment, the failure determination of the voltage detecting lines is performed with respect to each set of the voltage detecting lines adjoining to the short-circuiting switch $5Sw_i$. However, the failure determination may be performed for a multiple set of voltage detecting lines at one time unless the variations of the measured voltages overlap with each other. For example, since three continuous measured voltages are required in case of the inspection end condition A), the determination using the short-circuiting switch $Sw_i$ may be performed simultaneously with the determination using the short-circuiting switches $Sw_{i-3}$ and $Sw_{i+3}$. As described above, the measured voltages of two adjoining battery cells are used in case where the inspection does not aim at detecting the failure of the short-circuiting switches. Thus, the determination using the short-circuiting switches $Sw_{i-2}$ and $Sw_{i+2}$ may be performed at the same time.

Since the voltages of the battery cells cannot be correctly measured during the time when the diagnosis according to the method of the present disclosure is in progress, it is dangerous to use the battery during this time. Accordingly, the following diagnosis may be conducted at the timing at which there is no need to perform typical measurement. One method is to conduct the diagnosis when the assembled battery managing unit 3 clearly determines that the battery is not in operation. During the diagnosis, the assembled battery managing unit 3 may send a notice to a host system and may open the main circuit of the battery, thereby interrupting the flow of an electric current.

Each of the battery cells described in respect of the present embodiment indicates a voltage measurement unit. Although the voltage between the opposite electrodes of a single battery cell is measured in usual cases, it doesn't matter whether the voltage is measured with respect to a single battery cell or a combination of battery cells connected in parallel or in series. The voltage detecting lines set forth herein mean the lines drawn from the positive and negative electrodes of these measurement units. Connection points of a mechanical structure and a socket may exist somewhere along the voltage detecting lines.

While a single assembled battery control unit is used in the embodiment described above, it may be possible to employ a configuration in which a set of battery control units for controlling a plurality of assembled batteries is managed by a single battery managing unit. For example, battery control units A and B may be provided in a corresponding relationship with an assembled battery A and an assembled battery B each having N pieces of battery cells. A RC filter provided with a resistor $RA_i$ and a capacitor $CA_i$ and a RC filter provided with a resistor $RB_i$ and a capacitor $CB_i$ may be connected to battery cells $A_i$ and $B_i$. In addition, there may be provided short-circuiting switches $SwA_i$ and $SwB_i$. In this case, the failure detection process described above in respect of the foregoing embodiment can be simultaneously performed with respect to the assembled batteries A and B using the short-circuiting switches $SwA_i$ and $SwB_i$.

While certain embodiments of the present disclosure have been described above, these embodiments are presented by way of example and are not intended to limit the scope of the present disclosure. These embodiments can be modified in many different forms. Various types of omission, substitution and modification may be made without departing from the scope and spirit of the present disclosure. These embodiments and the modifications thereof fall within the scope and spirit of the present disclosure and are included in the scope of the present disclosure recited in the claims and the equivalent thereof.

What is claimed is:

1. An assembled battery system, comprising:
an assembled battery having a plurality of serially-connected battery cells;
voltage detecting lines connectable at one ends to electrodes of the battery cells of the assembled battery as a voltage measurement target;
electric resistors serially-connected at one ends to the other ends of the voltage detecting lines;
capacitors connected to the other ends of the electric resistors, each of the capacitors being configured to electrically interconnect one of the voltage detecting lines and the other voltage detecting line;
voltage measuring circuits connected respectively to each of the voltage detecting lines and configured to detect an electric potential difference between one of the voltage detecting lines and the other voltage detecting line;
electrically openable short-circuiting switches arranged between the capacitors and the voltage measuring circuits and parallel-connected to the capacitors, the voltage measuring circuits being configured to obtain a first measurement result by measuring an electric potential difference appearing between the opposite ends of the short-circuiting switches when one of the short-circuiting switches is opened and the other short-circuiting switches electrically adjoining to the opposite ends of one of the short-circuiting switches are opened, the voltage measuring circuits being further configured to obtain a second measurement result by measuring an electric potential difference appearing between the opposite ends of the short-circuiting switches when one of the short-circuiting switches is closed and the other short-circuiting switches electrically adjoining to the opposite ends of one of the short-circuiting switches are opened; and
a monitoring circuit configured to detect a difference between the first measurement result and the second measurement result with respect to each of the short-circuiting switches and to detect at least one of a failure based on the difference between the first measurement result and the second measurement result.

2. An assembled battery system of claim 1 wherein the monitoring circuit is configured to detect a failure of a selected voltage detecting line i if the voltage difference of short-circuiting switch i is down, the voltage difference of short-circuiting switch i−1 is up, and the voltage difference of short-circuiting switch i+1 is not up.

3. An assembled battery system of claim 1 wherein the monitoring circuit is configured to detect a failure of a selected voltage detecting line i+1 if the voltage difference of short-circuiting switch i is down, the voltage difference of short-circuiting switch i−1 is not up, and the voltage difference of short-circuiting switch i+1 is up.

4. An assembled battery system of claim 1 wherein the monitoring circuit is configured to detect a failure of a selected short-circuiting switch i if the voltage difference of short-circuiting switch i is not down, the voltage difference of short-circuiting switch i−1 is not up, and the voltage difference of short-circuiting switch i+1 is not up.

5. An assembled battery system of claim 1 wherein the monitoring circuit is configured to detect a failure of the voltage measuring circuits if the voltage difference of short-circuiting switch i−1 is up and the voltage difference of short-circuiting switch i is not down or if the voltage difference of short-circuiting switch i−1 is not up, the voltage difference of short-circuiting switch i is down, and the voltage difference of short-circuiting switch i+1 is up.

6. An assembled battery system of claim 1 wherein the monitoring circuit is configured to detect a normal condition of the assembled battery if the voltage difference of short-circuiting switch i is down, the voltage difference of short-circuiting switch i−1 is up, and the voltage difference of short-circuiting switch i+1 is up.

7. A method for detecting failures in a battery comprising:
opening a selected short circuiting switch;
opening short circuiting switches located adjacent to the selected short circuiting switch;
measuring the voltages of the open selected and open adjacent short circuiting switches to determine first voltage values;
closing the selected short circuiting switch;
measuring the voltage of the closed selected short circuiting switch to determine a second voltage value of the selected short circuiting switch;
measuring the voltages of the adjacent short circuiting switches to determine second voltage values of the adjacent short circuiting switches after the selected switch is closed; and
determining the occurrence of a fault based on the measured voltages.

8. The method of claim 7 wherein the fault comprises a failure of a selected voltage detecting line i if the voltage difference between the first and second voltage values of the selected short-circuiting switch i is down, the voltage difference between the first and second voltage values of adjacent short-circuiting switch i−1 is up, and the voltage difference between the first and second voltage values of adjacent short-circuiting switch i+1 is not up.

9. The method of claim 7 wherein the fault comprises a failure of adjacent voltage detecting line i+1 if the voltage difference between the first and second voltage values of adjacent short-circuiting switch i−1 is not up, the voltage difference between the first and second voltage values of the selected short-circuiting switch i is down, and the voltage difference between the first and second voltage values of adjacent short-circuiting switch i+1 is up.

10. The method of claim 7 wherein the fault comprises a failure of the selected short-circuiting switch i if the voltage difference between the first and second voltage values of the selected short-circuiting switch i is not down, the voltage difference between the first and second voltage values of adjacent short-circuiting switch i−1 is not up, and the voltage difference between the first and second voltage values of adjacent short-circuiting switch i+1 is not up.

11. The method of claim 7 wherein the fault comprises a failure to a voltage measuring unit if the voltage difference between the first and second voltage values of the selected short-circuiting switch i is not down and the voltage difference between the first and second voltage values of adjacent short-circuiting switch i−1 is up or if the voltage difference between the first and second voltage values of the selected short-circuiting switch i is down and the voltage difference between the first and second voltage values of adjacent short-circuiting switch i−1 is not up and the voltage difference between the first and second voltage values of adjacent short-circuiting switch i+1 is not up.

12. The method of claim 7 further comprising determining that the battery is normal if the voltage difference between the first and second voltage values of the selected short-circuiting switch i is down, the voltage difference between the first and second voltage values of adjacent short-circuiting switch i−1 is up, and the voltage difference between the first and second voltage values of adjacent short-circuiting switch i+1 is up.

13. A method for detecting failures in a battery comprising the steps of:
(a) turning off all short-circuiting switches in the battery;
(b) measuring first voltages of all battery cells in the battery;
(c) turning on a selected short-circuiting switch;
(d) measuring a second voltage of a selected battery cell that is associated with the selected short-circuiting switch;
(e) measuring a second voltage of battery cells adjacent to the selected battery cell; and
(f) detecting a failure based on the measured voltages.

14. The method according to claim 13 further comprising the step of, after turning on the selected short-circuiting switch, waiting for a time period in which variations of the voltage values to be measured substantially disappear before measuring the voltage the selected battery cell and the adjacent battery cells.

15. The method according to claim 13 further comprising the steps of:
(g) turning off the selected short-circuiting switch; and
(h) repeating steps (c) through (g) for all short-circuiting switches in the battery that have not yet been selected.

16. The method according to claim 15 further comprising, before repeating step (c), waiting for a time period in which variations of the voltage values to be measured substantially disappear.

17. The method of claim 13 wherein the failure comprises a failure of a voltage detecting line i associated with the selected short-circuiting switch i if the voltage difference between the first and second voltage values of the selected short-circuiting switch i is down, the voltage difference between the first and second voltage values of adjacent short-circuiting switch i−1 is up, and the voltage difference between the first and second voltage values of adjacent short-circuiting switch i+1 is not up.

18. The method of claim 13 wherein the failure comprises a failure of adjacent voltage detecting line i+1 if the voltage difference between the first and second voltage values of adjacent short-circuiting switch i−1 is not up, the voltage difference between the first and second voltage values of the selected short-circuiting switch i is down, and the voltage difference between the first and second voltage values of adjacent short-circuiting switch i+1 is up.

19. The method of claim 13 wherein the failure comprises a failure of the selected short-circuiting switch i if the voltage difference between the first and second voltage values of the selected short-circuiting switch i is not down, the voltage difference between the first and second voltage values of adjacent short-circuiting switch i−1 is not up, and the voltage difference between the first and second voltage values of adjacent short-circuiting switch i+1 is not up.

20. The method of claim 13 wherein the failure comprises a failure to a voltage measuring unit if the voltage difference between the first and second voltage values of the selected short-circuiting switch i is not down and the voltage difference between the first and second voltage values of adjacent short-circuiting switch i−1 is up or if the voltage difference between the first and second voltage values of the selected short-circuiting switch i is down and the voltage difference between the first and second voltage values of adjacent short-circuiting switch i−1 is not up and the voltage difference between the first and second voltage values of adjacent short-circuiting switch i+1 is not up.

* * * * *